(12) United States Patent
Ito et al.

(10) Patent No.: US 7,639,044 B2
(45) Date of Patent: Dec. 29, 2009

(54) SEMICONDUCTOR INTEGRATED CIRCUIT, SEMICONDUCTOR INTEGRATED CIRCUIT CONTROL METHOD, AND SIGNAL TRANSMISSION CIRCUIT

(75) Inventors: Minoru Ito, Shiga (JP); Hidekichi Shimura, Tokyo (JP)

(73) Assignee: Panasonic Corporation, Osaka (JP)

( * ) Notice: Subject to any disclaimer, the term of this patent is extended or adjusted under 35 U.S.C. 154(b) by 173 days.

(21) Appl. No.: 11/814,691

(22) PCT Filed: Feb. 17, 2006

(86) PCT No.: PCT/JP2006/302878

§ 371 (c)(1),
(2), (4) Date: Jul. 25, 2007

(87) PCT Pub. No.: WO2006/090651

PCT Pub. Date: Aug. 31, 2006

(65) Prior Publication Data

US 2009/0015293 A1    Jan. 15, 2009

(30) Foreign Application Priority Data

Feb. 25, 2005    (JP)    ............................. 2005-051587

(51) Int. Cl.
*H03K 10/094* (2006.01)
(52) U.S. Cl. .......................................... 326/83; 326/87
(58) Field of Classification Search ............. 326/68–73, 326/80–83, 86, 87
See application file for complete search history.

(56) References Cited

U.S. PATENT DOCUMENTS 5,454,697 A    10/1995   Nakanishi
5,610,533 A    3/1997    Arimoto et al.
5,703,522 A    12/1997   Arimoto et al.
5,854,561 A    12/1998   Arimoto et al.

(Continued)

FOREIGN PATENT DOCUMENTS

JP    6235088    2/1987

(Continued)

OTHER PUBLICATIONS

English Language Abstract of JP 2001-332695, Nov. 30, 2001.

(Continued)

*Primary Examiner*—Don P Le
(74) *Attorney, Agent, or Firm*—Greenblum & Bernstein P.L.C.

(57) ABSTRACT

A semiconductor integrated circuit, a semiconductor integrated circuit control method, and a signal transmission circuit realizing optimization of the performance of a semiconductor integrated circuit and reduction of the power consumption. In the semiconductor integrated circuit, the semiconductor integrated circuit control method, and the signal transmission circuit, functional circuit blocks are composed of MIS transistors fabricated on an SOI structure silicon substrate and have at least one potential set including a high-potential side potential, a low-potential side potential, a substrate potential of a P-channel MIS transistor, and a substrate potential of an N-channel MIS transistor. Power supply wirings supply voltages to the potentials included in the potential set, a controller determines the values of the voltages induced in the power supply wirings and instructs a power supply control IC to generate the voltages of the determined values, and the power supply control IC generates the voltages induced in the power supply wirings according to the instruction of the controller.

21 Claims, 14 Drawing Sheets

U.S. PATENT DOCUMENTS

| | | |
|---|---|---|
| 5,892,260 A | 4/1999 | Okumura et al. |
| 6,232,793 B1 | 5/2001 | Arimoto et al. |
| 6,302,144 B1 | 10/2001 | Graham et al. |
| 6,831,483 B2 | 12/2004 | Shimazaki et al. |
| 7,129,751 B2 * | 10/2006 | Jahan et al. .............. 326/68 |
| 7,498,842 B2 * | 3/2009 | Williams .............. 326/81 |
| 2001/0043085 A1 | 11/2001 | Shimzaki et al. |
| 2002/0113616 A1 | 8/2002 | Shimzaki et al. |
| 2004/0051556 A1 | 3/2004 | Shimzaki et al. |
| 2005/0100461 A1 | 5/2005 | Izutani et al. |
| 2007/0045744 A1 | 3/2007 | Ito |
| 2007/0085596 A1 | 4/2007 | Ito |
| 2007/0176673 A1 | 8/2007 | Ito |

FOREIGN PATENT DOCUMENTS

| | | |
|---|---|---|
| JP | 219646 | 1/1990 |
| JP | 4130764 | 5/1992 |
| JP | 06280707 | 10/1994 |
| JP | 8226357 | 9/1995 |
| JP | 8-017183 A | 1/1996 |
| JP | 08177668 | 7/1996 |
| JP | 8204140 | 8/1996 |
| JP | 2001249011 | 9/2000 |
| JP | 2001099029 | 4/2001 |
| JP | 2001214826 | 8/2001 |
| JP | 2001267910 | 9/2001 |
| JP | 2001332695 | 11/2001 |
| JP | 2002303217 | 10/2002 |
| JP | 2002305434 | 10/2002 |
| JP | 2003124794 | 4/2003 |
| JP | 2004278355 | 10/2004 |
| JP | 2005155602 | 6/2005 |

OTHER PUBLICATIONS

English Language Abstract of JP 2001-267910, Mar. 28, 2001.
English Language Abstract of JP 2003-124794, Apr. 25, 2003.
English Language Abstract of JP 4-130764, May 1, 1992.
English Language Abstract of JP 8-204140, Aug. 9, 1996.
English Language Abstract of JP 2002-305434, Oct. 18, 2002.
English language Abstract of JP 8-017183 A, Jan. 19, 1996.

* cited by examiner

SEMICONDUCTOR INTEGRATED CIRCUIT, SEMICONDUCTOR INTEGRATED CIRCUIT CONTROL METHOD, AND SIGNAL TRANSMISSION CIRCUIT

TECHNICAL FIELD

The present invention relates to a semiconductor integrated circuit, a control method thereof and a signal transmission circuit. More particularly, the present invention relates to a semiconductor integrated circuit realizing high-speed operation and low power consumption.

BACKGROUND ART

In recent years, there has been a strong demand for high-speed and low power consumption semiconductor integrated circuits. In order to realize high-speed semiconductor integrated circuits, it is well known that in addition to making semiconductor circuits with finer detail and making a gate length of a MIS (Metal Insulated Semiconductor) transistor or MOS (Metal Oxide Semiconductor) transistor short, it is extremely effective to lower a threshold voltage.

However, when the threshold voltage is set too low, there is a problem that power consumed by the semiconductor integrated circuit becomes extremely large because of the increase in a sub threshold leakage current that is unnecessary current flowing between the source and drain of a MOS transistor.

In the related art, a method of making substrate potentials (Vbp) of P-channel MOS transistors and substrate potentials (Vbn) of N-channel MOS transistors common, respectively, increasing a potential difference (power supply voltage) between a high-potential side potential (Vdd) and a low potential side potential (Vss) at high-speed cells, and reducing a power supply voltage at low power cells, is well-known (for example, refer to FIG. 1 of patent document 1).

Namely, the threshold voltage is set to a small value by applying a large power supply voltage to a high-speed cell and applying a voltage to a substrate bias in a forward direction. Further, the threshold voltage is set to a large value by applying a small power supply voltage to low power cells and applying a voltage to a substrate bias in a reverse direction.

Moreover, it is also well-known that a level shift circuit is provided between circuits in order to amplify the output amplitude of the transmitting side circuit so as to exceed the switching voltage of the receiving side circuit and prevent a penetration current of the receiving side circuit, when a signal is transmitted from a logic circuit having a small power supply voltage to a logic circuit having a large power supply voltage (patent document 1).

Patent Document 1: Japanese Patent Application Laid-Open No. 2001-332695.

DISCLOSURE OF THE INVENTION

Problems to be Solved by the Invention

However, with the method disclosed in patent document 1, the substrates (well regions) of P-channel MOS transistors and the substrates (well regions) of N-channel MOS transistors on the silicon substrate are common, respectively, and there is a limitation in flexibility in drive power control of the MOS transistor and low power consumption control of the integrated circuit. Therefore, there is a problem in this method that only limited advantages can be obtained in drive power control and low power consumption control. The substrates (well regions) of MOS transistors are made common, because it is structurally difficult to electrically separate well regions of the same conductive type as the silicon substrate in normal CMOS process.

FIG. 14 shows a cross-sectional structure of normal P-channel MOS transistors and N-channel MOS transistors formed on a P-type silicon substrate. FIG. 14 shows an example of P-type silicon substrate 90 where N-wells 92 and 94 can be electrically separated from each other but P-wells 91 and 93 are electrically connected via P-type silicon substrate 90 and therefore cannot be electrically separated. Further, although not shown in FIG. 14, in the case of an N-type silicon substrate, P-wells can be electrically separated, but the N-wells are electrically connected via the N-type silicon substrate. Moreover, methods using a multi-layer well structure have been considered, but the manufacturing process becomes complicated, and it is necessary to resolve the problem of latch up phenomena peculiar to a CMOS structure.

Further, as shown in the example of the related art, when a signal is transmitted from a logic circuit having a small power supply voltage to a logic circuit having a large power supply voltage, a level shift circuit is inserted. As a result, the delay time of the logic circuit becomes longer and hiders high-speed operation. Further, there is a problem that a circuit scale increases.

It is therefore an object of the present invention to provide a semiconductor integrated circuit, semiconductor integrated circuit control method and signal transmission circuit capable of optimizing performance of the semiconductor integrated circuit and reducing power consumption.

Means for Solving the Problem

A semiconductor integrated circuit of the present invention is configured with MIS (Metal Insulated Semiconductor) transistors formed on a silicon substrate having an SOI (Silicon On Insulator) structure, and has a first logic gate and a second logic gate, wherein the first logic gate takes a first potential set having a relatively small potential difference as a power supply voltage; the second logic gate takes a second potential set having a relatively large potential difference as a power supply voltage; and the semiconductor integrated circuit satisfies at least one of a condition that a substrate potential of a P-channel MIS transistor of the first logic gate is equal to or higher than a substrate potential of a P-channel MIS transistor of the second logic gate, and a condition that a substrate potential of an N-channel MIS transistor of the first logic gate is equal to or lower than a substrate potential of an N-channel MIS transistor of the second logic gate.

Advantageous Effect Of The Invention

According to the present invention, it is possible to optimize performance of the semiconductor integrated circuit and reduce the power consumption.

BEST MODE FOR CARRYING OUT THE INVENTION

In each embodiment, a case will be described as an example where a semiconductor integrated circuit is provided with function circuit blocks for implementing predetermined functions. The function circuit blocks are configured with MOS transistor circuits, which are typical examples of MIS transistors. In the following description, a circuit block includes at least one circuit (logic circuit). Further, circuit groups are used when circuits are divided into groups according to the function and property of the circuit. Moreover, the circuit may be configured with one or a plurality of logic gates.

Further, high-potential side potential (Vdd), low potential side potential (Vss), P-channel MOS transistor substrate potential (Vbp) and N-channel MOS transistor substrate potential (Vbn) are used. Moreover, the power supply voltage is the potential difference between Vdd and Vss and can be calculated using the expression (Vdd-Vss). The substrate bias corresponds to a value obtained by subtracting Vss from Vbn, and a value obtained by subtracting Vdd from Vbp. Further, the threshold voltage is a gate voltage where the drain current flows out (source potential reference), and the switching voltage is a threshold value of a voltage for recognizing at the receiving side logic circuit whether an input signal is a high level or low level. These are assumed.

In the following description, Vdd, Vss, Vbp and Vbn are described as generic names and indicate potentials. On the other hand, in the case of adding alphabets or numerals to the names of potentials, such as VddA1, VssA1, VbpA1 and VbnA1, for example, potentials of specific function circuit blocks (or circuit groups or circuit blocks) are indicated.

Embodiments of the present invention will be described in detail with reference to the accompanying drawings. The following description is provided as an example and does not limit the scope of the present invention.

Embodiment 1

Figure 1:
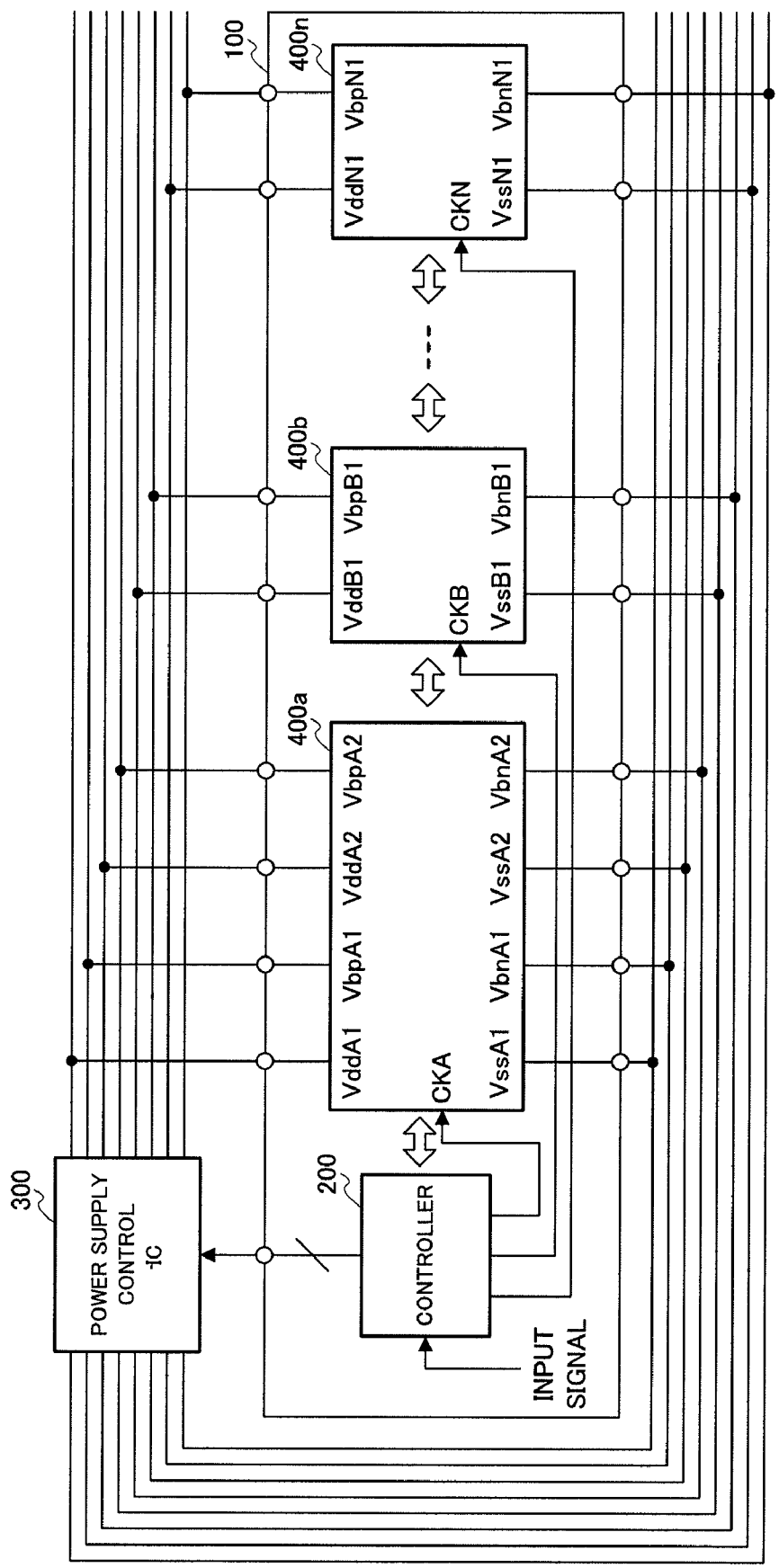
FIG. 1 is a circuit block diagram of a semiconductor integrated circuit and a power supply control IC according to Embodiment 1 of the present invention.
Figure 2:
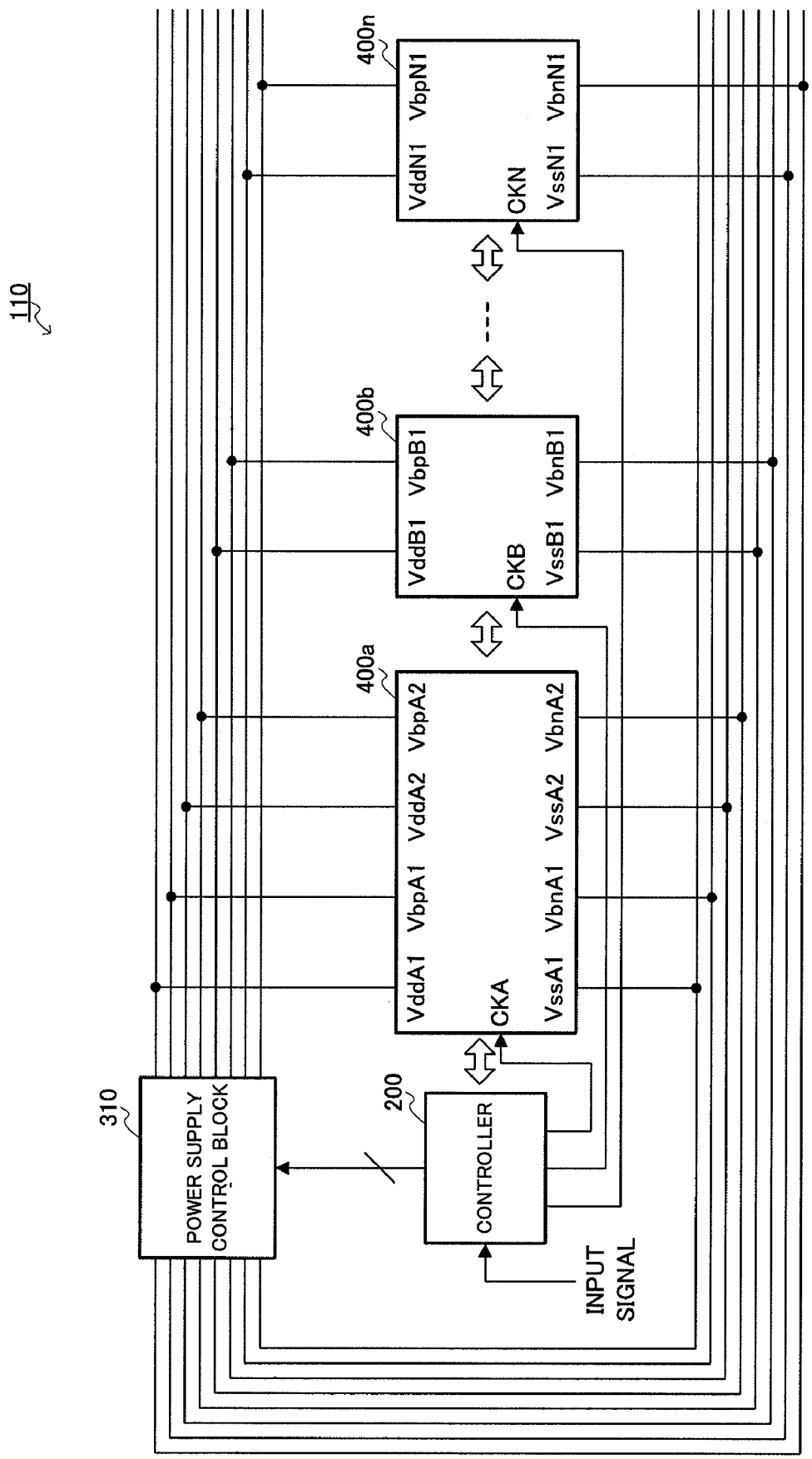
FIG. 2 is a circuit block diagram of a power supply control block built into the semiconductor integrated circuit according to Embodiment 1.

FIG. 1 shows an example of a circuit block diagram of a semiconductor integrated circuit and a power supply control IC (Integrated Circuit) according to Embodiment 1 of the present invention. FIG. 2 shows an example of a circuit block diagram of a power supply control block built into the semiconductor integrated circuit according to Embodiment 1. The power supply control IC and the power supply control block are shown as an example of a power supply control section that applies (supplies) a voltage.

First, a circuit configuration of a semiconductor integrated circuit corresponding to this embodiment will be described using FIG. 1 and FIG. 2.

The circuit block shown in FIG. 1 is provided with semiconductor integrated circuit 100 and power supply control IC 300. Semiconductor integrated circuit 100 is provided with controller 200 and function circuit blocks 400a to 400n. Semiconductor integrated circuit 100 is provided with two sets of potentials (VddA1, VssA1, VbpA1, VbnA1, VddA2, VssA2, VbpA2 and VbnA2) at function circuit block 400a. One set of potentials (VddB1, VssB1, BbpB1, VbnB1, to VddN1, VssN1, VbpN1 and VbnN1) are provided at a plurality of function blocks from function circuit block 400b to function circuit block 400n. Controller 200 transmits a signal to power supply control IC 300 positioned outside of semiconductor integrated circuit 100, and power supply control IC 300 generates a voltage corresponding to the transmitted signal and applies the generated voltage to the potential sets (Vdd, Vss, Vbp and Vbn) of function circuit blocks 400a to 400n. Semiconductor integrated circuit 100 is provided with a plurality of power supply wiring that supplies voltages to the potentials of the potential sets, respectively, and each of the plurality of power supply wiring is connected to each potential of the potential sets. Moreover, controller 200 controls the clock frequencies of clocks supplied to function circuit blocks 400a to 400n.

FIG. 2 shows a configuration where power supply control block 310 is built into semiconductor integrated circuit 110, and other components are configured in the same way as in FIG. 1. The function of controller 200 is the same as FIG. 1, and different in that a signal is transmitted to power supply control block 310.

In the case of FIG. 1 and FIG. 2, the number of power supply wiring for Vdd, Vss, Vbp and Vbn of function circuit blocks 400a to 400n extremely increases, but in the manufacturing process, implementation is comparatively simple by using multi-layer metal wiring layers for the power supply wiring.

Next, the operation of semiconductor integrated circuits 100 and 110 of the present invention will be described. Here, power supply control IC 300 or power supply control block 310 will be described as a power supply control section. Controller 200 manages workload and processing speed of function circuit blocks 400a to 400n. Controller 200 is configured with, for example, a CPU (Central Processing Unit) and ROM (Read Only Memory) RAM (Random Access Memory) or a dedicated logic circuit. When controller 200 receives a signal from an external controller, a signal from a manual switch, external data, or the like, via an input circuit as an input signal, controller 200 switches between a plurality of operating modes, calculates processing speed and operating conditions according to the workload required for function circuit blocks 400a to 400n, controls a clock frequency based on the calculated results, and transmits the signal (control data) to the power supply control section. The power supply control section generates voltages according to the signal, and applies the generated voltages to the potential sets (Vdd, Vss, Vbp and Vbn) of function circuit blocks 400a to 400n. As a result, function circuit blocks 400a to 400n are supplied with optimum clock frequencies, power supply voltages and threshold voltages.

Controller 200 then calculates processing speed and operating conditions according to the workload required for function circuit blocks 400a to 400n as follows. For example, when the required workload of an arbitrary function circuit block is a maximum, controller 200 makes the power supply voltage a maximum, suppresses a threshold voltage to a minimum, and also makes the clock frequency a maximum. In this case, this function circuit block is capable of carrying out processing at a maximum speed. Further, conversely, when there is no required workload, controller 200 makes the power supply voltage a minimum, or 0 (zero) depending on the case, controls the threshold voltage to be a maximum or an appropriate value, and stops the clock frequency. In this case, the function circuit block enters a resting state (stopped state) where power is not consumed. When the required workload is a medium degree, controller 200 sets the clock frequency to be a frequency corresponding to the required processing speed, performs control to obtain a minimum power supply voltage and a maximum threshold voltage for operation at this clock frequency, optimizes performance, and minimizes power consumption. In this case, the function circuit block executes processing at a low speed.

Figure 3:
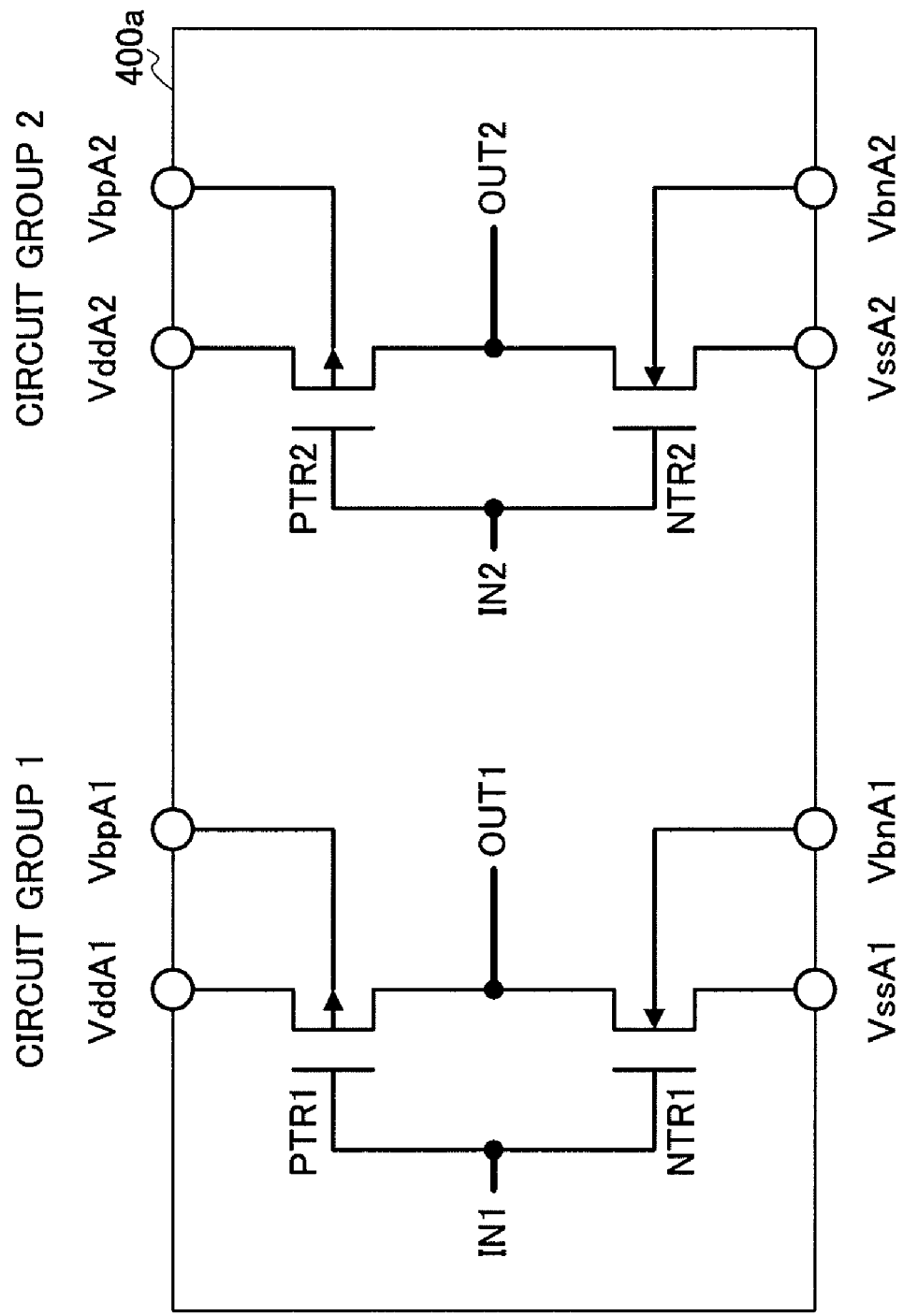
FIG. 3 shows an example of the inside of a function circuit block within the semiconductor integrated circuit according to Embodiment 1.

FIG. 3 shows an example of the inside of a function circuit block within the semiconductor integrated circuit according to Embodiment 1. In FIG. 3, function circuit block 400a is shown as an example. Function circuit block 400a includes circuit group 1 and circuit group 2. Circuit group 1 configures an inverter circuit with P-channel MOS transistor PTR1 and N-channel MOS transistor NTR1, and has VddA1, VssA1, VbpA1 and VbnA1 as potential sets. Circuit group 2 configures an inverter circuit with P-channel MOS transistor PTR2 and N-channel MOS transistor NTR2, and has VddA2, VssA2, VbpA2 and VbnA2 as potential sets. Circuit group 1 and circuit group 2 are configured with partially depleted MOS transistors formed on an SOI structure silicon substrate.

Figure 4:
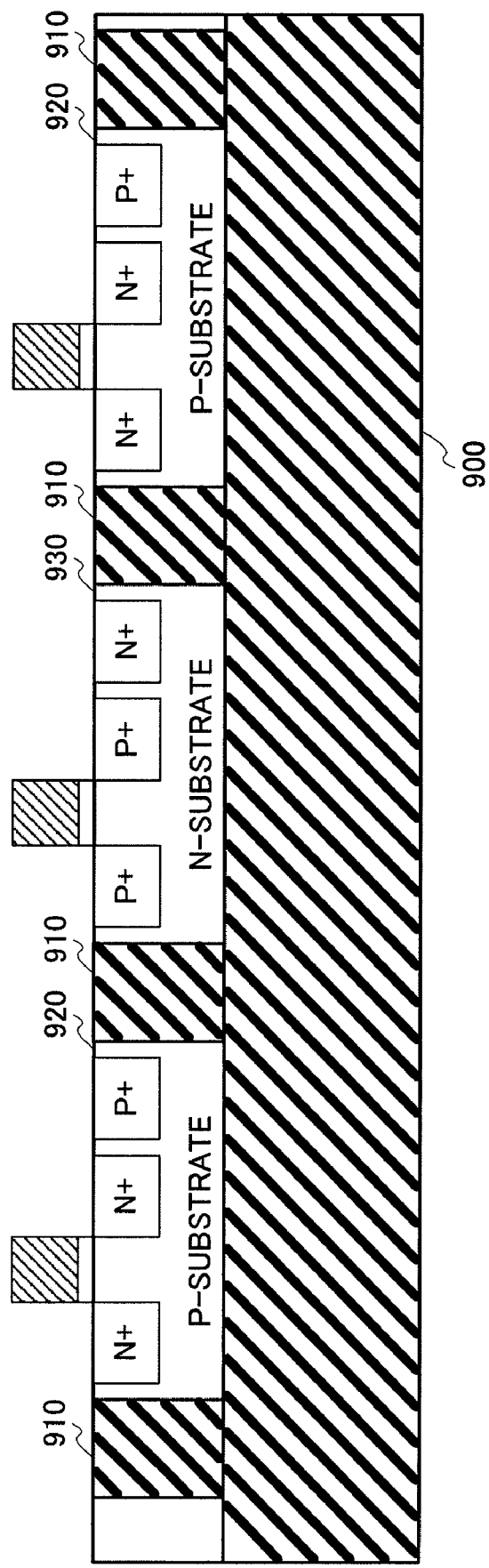
FIG. 4 shows a CMOS transistor structure built on an SOI structure silicon substrate.

FIG. 4 shows a CMOS transistor structure built on the SOI structure silicon substrate. P-substrate 920 and N-substrate 930 are respectively formed on insulating isolating layer 900. Further, insulating isolating region 910 is formed between P-substrate 920 and N-substrate 930. As shown in FIG. 4, it is possible to electrically separate the substrate for each arbitrary MOS transistor group or for each MOS transistor using partially depleted MOS transistors formed on the SOI structure silicon substrate. It is therefore not necessary to make VbpA1 and VbpA2 that are substrate potentials of P-channel MOS transistors the same potential. Similarly, it is also not necessary to make VbnA1 and VbnA2 that are substrate potentials of N-channel MOS transistors the same potential. Further, the P-substrate and N-substrate are completely insulated and separated from each other, and therefore a problem of the latch-up phenomena does not occur.

As a result, controller 200 can adjust a power supply voltage and threshold voltage using a potential that is different for each circuit group. Further, each function circuit block can operate at an optimum clock frequency, power supply voltage and threshold voltage, so that it is also possible to optimize performance and minimize power consumption.

Figure 5:
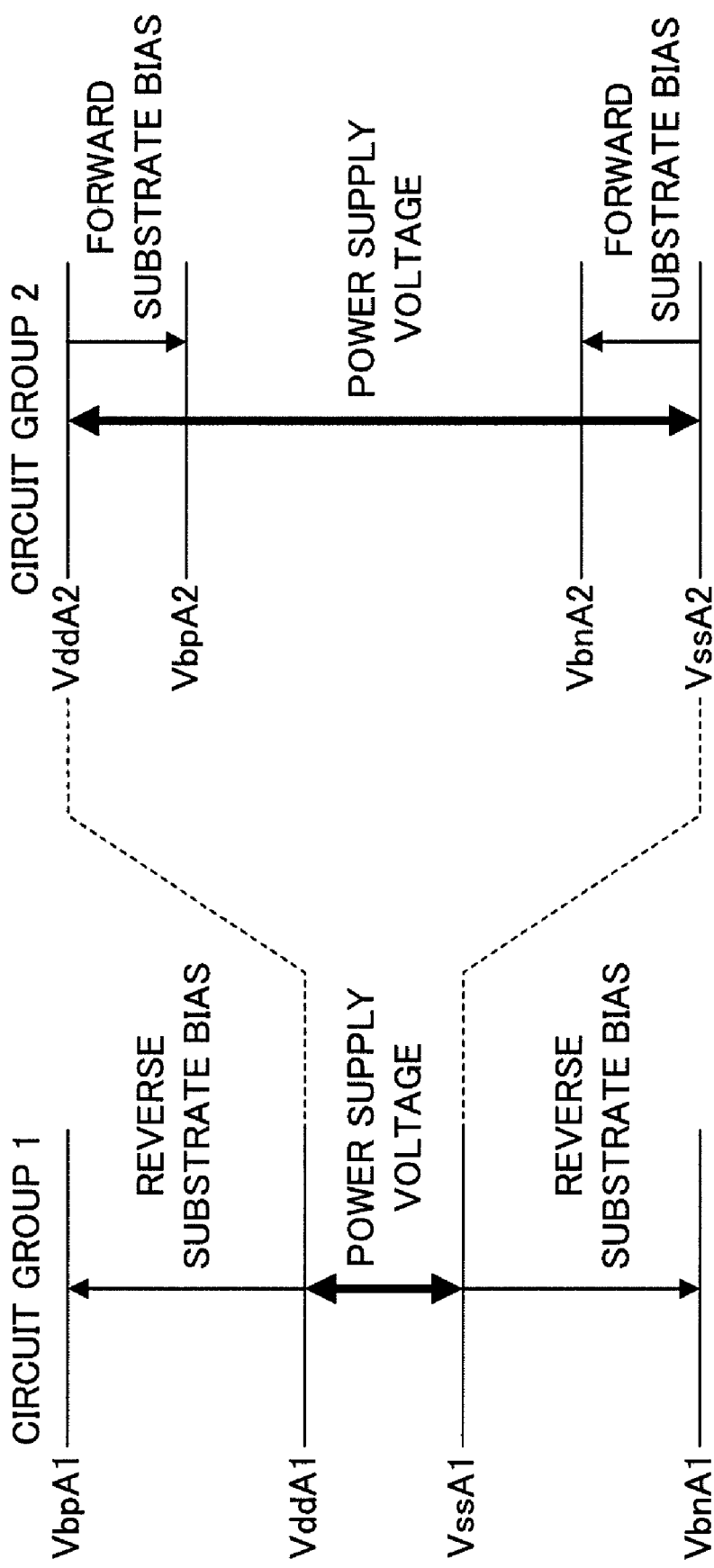
FIG. 5 shows the relationship of applied voltages between a low power consumption operation and a high-speed operation (high power consumption operation)

FIG. 5 shows the relationship of applied voltages between a low power consumption operation and a high-speed operation (high power consumption operation). FIG. 5 shows applied voltages of Vdd, Vss, Vbp and Vbn for the case where circuit group 1 (left side of the drawing) operates at low power consumption and circuit group 2 (right side of the drawing) operates at high speed. Controller 200 determines settings of voltages applied to circuit group 1 and circuit group 2 as follows.

Circuit group 1 that operates at low power consumption makes a power supply voltage (difference between VddA1 and VssA1 shown by the thick arrow in the drawing) small. Circuit group 1 applies a substrate bias to substrate P in a reverse direction by setting VbpA1 to a higher voltage than VddA1. Similarly a substrate bias is applied to substrate N in a reverse direction by setting VbnA1 to a lower voltage than VssA1. As a result, in circuit group 1, the absolute value of the threshold voltage at the P-channel MOS transistor and the N-channel MOS transistor becomes large. Circuit group 1 is therefore a MOS transistor appropriate for low power consumption.

Further, circuit group 2 that operates at high speed makes a power supply voltage (difference between VddA2 and VssA2 shown by the thick arrow in the drawing) large. Circuit group 2 applies a substrate bias to substrate P in a forward direction by setting VbpA2 to a lower voltage than VddA2. Similarly, a substrate bias is applied to substrate N in a forward direction by setting VbnA2 to a higher voltage than VssA2. As a result, in circuit group 2, the absolute value of the threshold voltage at the P-channel MOS transistor and the N-channel MOS transistor becomes small. Therefore, circuit group 2 is a MOS transistor appropriate for high-speed operation.

Figure 6:
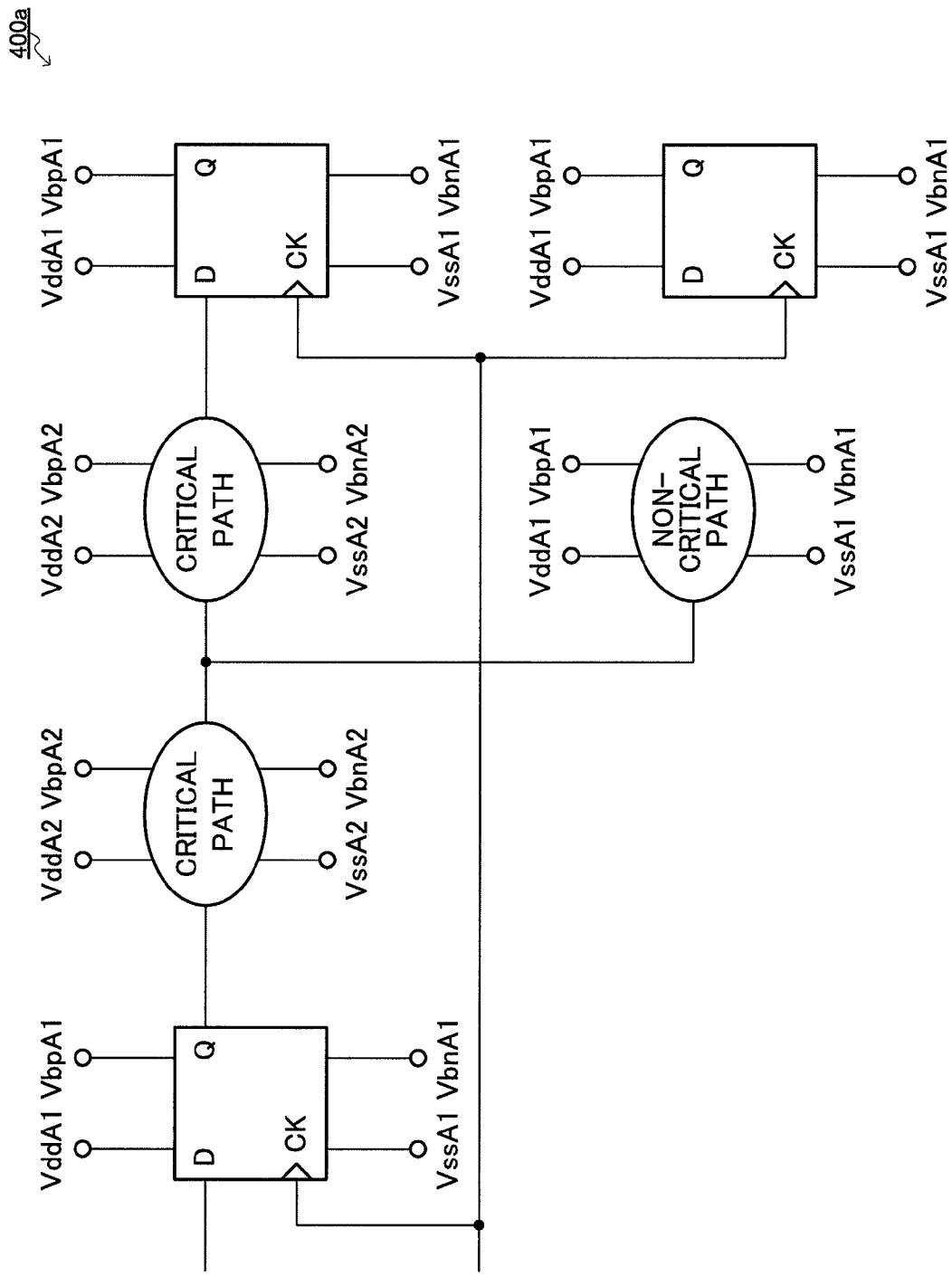
FIG. 6 shows an example of a circuit including a critical path and a non-critical path within the function circuit block.

Next, a case will be described using FIG. 6 where a critical path and non-critical path exist within the function circuit block. FIG. 6 shows an example of a circuit including a critical path and a non-critical path within the function circuit block. FIG. 6 shows a circuit when circuit group 2 is taken as a critical path (a path with no timing margin) and circuit group 1 is taken as a non-critical path.

In the case of the circuit configuration of function circuit block 400a shown in FIG. 6, by setting VddA2 to be a higher voltage than BbpA2 and setting VssA2 to be a lower voltage than VbnA2, circuit group 2 makes the power supply voltage applied to VddA2 and VssA2 large and makes the threshold voltage small by applying a substrate potential to the N-channel MOS transistor in a forward direction. Circuit group 2 is therefore appropriate for high-speed operation.

Further, by setting VddA1 to a lower voltage than VbpA1, and setting VssA1 to a higher voltage than VbnA1, circuit group 1 makes the power supply voltage applied to VddA1 and VssA1 small and makes the threshold voltage large by applying a substrate potential in a reverse direction to the N-channel MOS transistor. Therefore circuit group 1 is not required to operate at high speed and appropriate for low power consumption operation.

Figure 7:
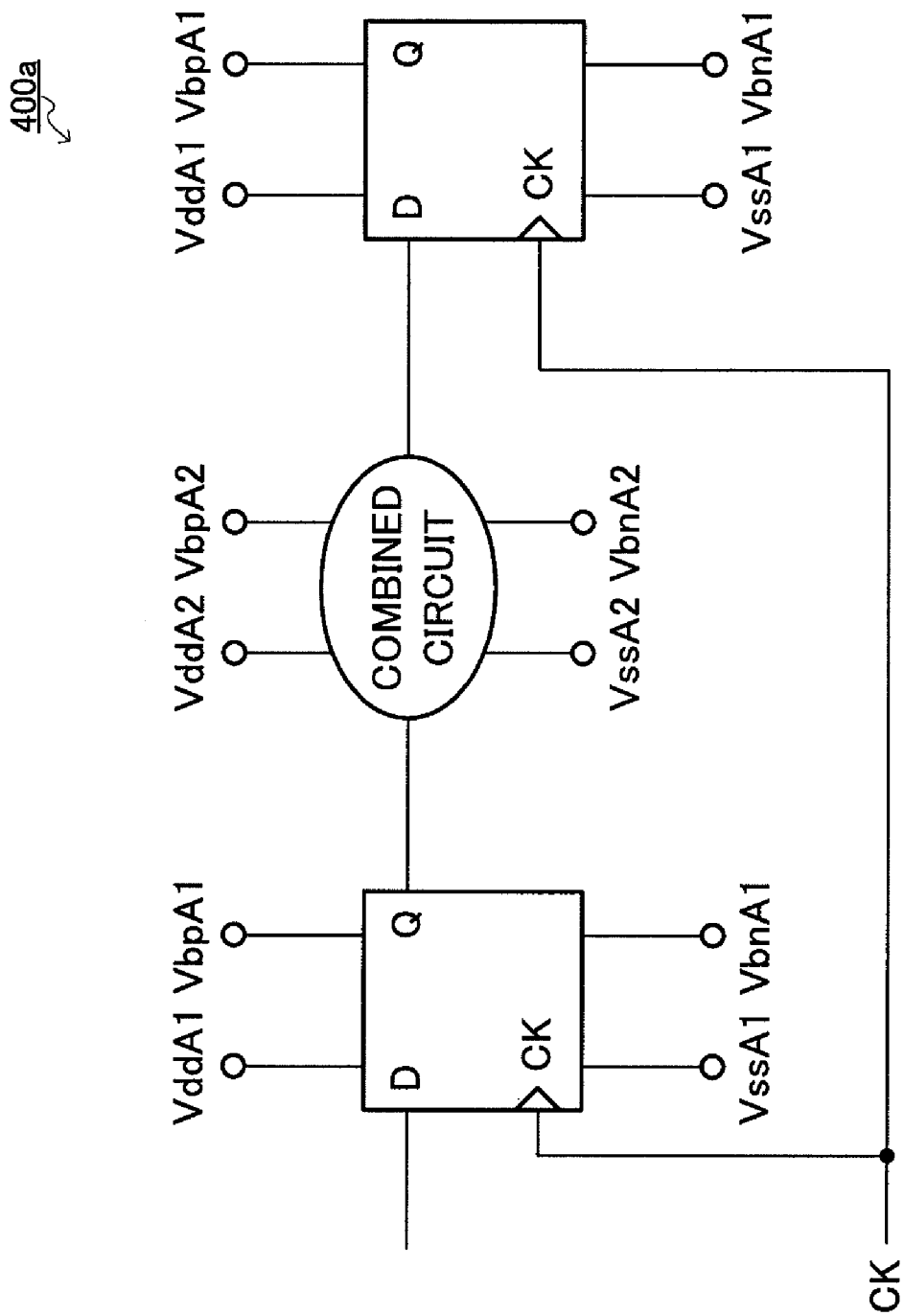
FIG. 7 shows an example of a circuit including a storage element within the function circuit block.

FIG. 7 shows an example of a circuit including a storage element within the function circuit block. FIG. 7 shows a circuit diagram where circuit group 1 is a storage element section (a flip-flop, here), and circuit group 2 is a combined circuit as a configuration other than the storage element.

Function circuit block 400a shown in FIG. 7 fixes the clock (CK) at a low level or a high level, and sets the flip-flop in a data holding state. After this, controller 200 can adopt a power supply interruption mode by setting all of VddA2, VbpA2, VssA2 and VbnA2 or just VddA2 and VssA2 of the potential set of circuit group 2 of function circuit block 400a to the same arbitrary potential. By this means, it is possible to suppress power consumption while holding internal data of function circuit block 400a during standby.

Therefore, as shown in FIG. 6 and FIG. 7, within the function circuit block, it is possible to increase flexibility in timing adjustment and low power consumption control by making it possible to set Vdd, Vss, Vbp and Vbn separately for critical paths and non-critical paths, or storage elements and elements other than storage elements, or combination of these.

A control method for controlling a power supply voltage, threshold voltage and clock frequency using a semiconductor integrated circuit described in the above embodiment adopts a configuration having: a circuit block that is configured with MOS transistors formed on an SOI structure silicon substrate and has at least one potential set of Vdd, Vss, Vbp and Vbn; a plurality of power supply wiring that supplies voltages to the potentials included in the potential set; a power supply control section that generates voltages to the plurality of power supply wiring; and a controller that instructs the power supply control section, wherein the controller determines values for the voltages generated to the plurality of power supply wiring, instructs the power supply control section to generate voltages of the determined values, and controls a clock frequency of clocks supplied to the circuit block.

Further, the controller has a program inside for determining voltages of potential sets, which is designed, created and burned to a ROM and the like in advance. The controller holds a plurality of patterns for calculating voltages of the potential sets using the configuration of the function blocks of the semiconductor integrated circuit. The controller calculates voltages appropriate for functions of the function blocks from the plurality of patterns based on inputted input signals or signals inputted from the function circuit blocks.

In this way, the semiconductor integrated circuit of this embodiment is configured with logic circuits of partially depleted MOS transistors formed on an SOI structure silicon substrate, one or more sets of Vdd and Vss supplied to each function circuit block within the semiconductor integrated circuit, a substrate potential (Vbp) of the P-channel MOS transistor, and a substrate potential (Vbn) of the N-channel MOS transistor. Signals are transmitted from the controller to the power supply control IC or the power supply control block, the power supply control IC or power supply control block then generates a voltage corresponding to this signal, and this voltage is applied to Vdd, Vss, Vbp and Vbn of the function circuit blocks. Further, the controller controls the clock frequencies of the clocks supplied to the function circuit blocks.

As a result, the semiconductor integrated circuit can freely set Vbp or Vbn without making Vbp and Vbn common among a plurality of potential sets. Further, the function blocks can optimize clock frequencies, power supply voltages and threshold voltages. It is therefore possible to optimize performance of the semiconductor integrated circuit and minimize power consumption.

Embodiment 2

In Embodiment 2, control of a switching voltage and control of a power supply voltage among a plurality of function circuit blocks (or among a plurality of circuit blocks) will be described. If not clearly defined, a description is given assuming the configurations of semiconductor integrated circuits 100 and 110 shown in FIG. 1 and FIG. 2.

Figure 8:
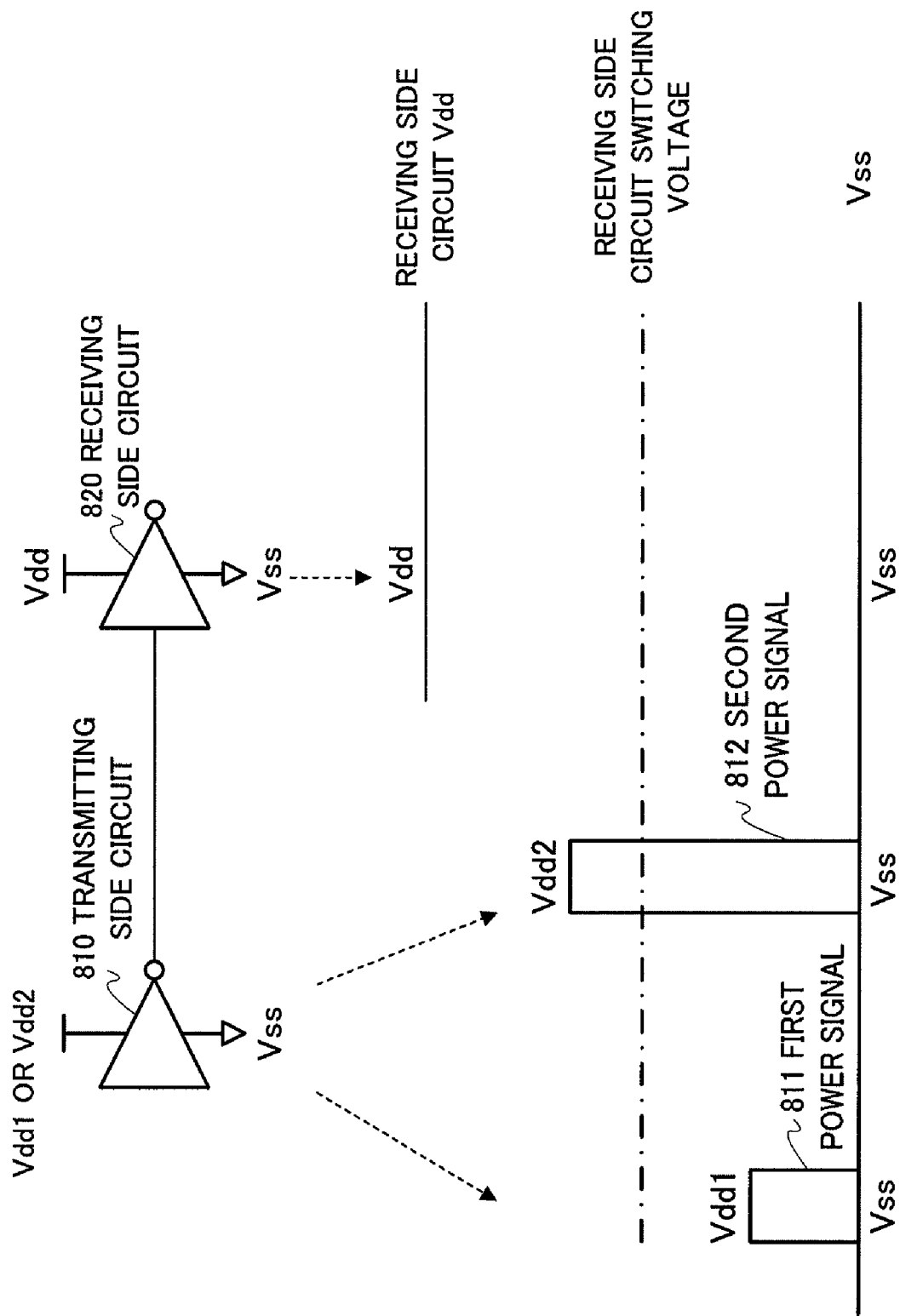
FIG. 8 illustrates the related art of signal transmission when Vss is fixed and Vdd is variable.

First, signal transmission of the related art will be described using FIG. 8, and signal transmission of this embodiment will be described using FIG. 9. FIG. 8 is a diagram of the related art illustrating signal transmission when Vss is fixed and Vdd is variable. FIG. 8 shows a relationship between an output signal of a transmitting side circuit and a switching voltage of a receiving side circuit upon signal transmission between function circuit blocks having different power supply voltages. The case where a signal is transmitted from transmitting side circuit 810 to receiving side circuit 820 is shown.

The upper part of FIG. 8 shows an example of transmitting side circuit 810 and receiving side circuit 820. Further, two cases are shown for transmitting side circuit 810, that is, the case where the high-potential side potential is Vdd1, and the case where the high-potential side potential is Vdd2 that is higher than Vdd1. The lower part of FIG. 8 shows the potentials for transmitting side circuit 810 and receiving side circuit 820, and transmitting side circuit 810 outputs first output signal 811 when the high-potential side potential is Vdd1, and outputs second output signal 812 when the high-potential side potential is Vdd2. In the method of the related art, Vss is made fixed, and Vdd1, Vdd2 and Vdd are made variable. Therefore, the signal is transmitted because second output signal 812 of transmitting side circuit 810 exceeds the switching voltage of receiving side circuit 820, but the output amplitude of first output signal 811 of transmitting side circuit 810 does not exceed the switching voltage, and therefore the signal is not transmitted to receiving side circuit 820. Level shift circuits are commonly inserted between function circuit blocks having different power supply voltages. Further, although not shown in the drawings, the same phenomena occur when Vss is made slightly variable.

Figure 9:
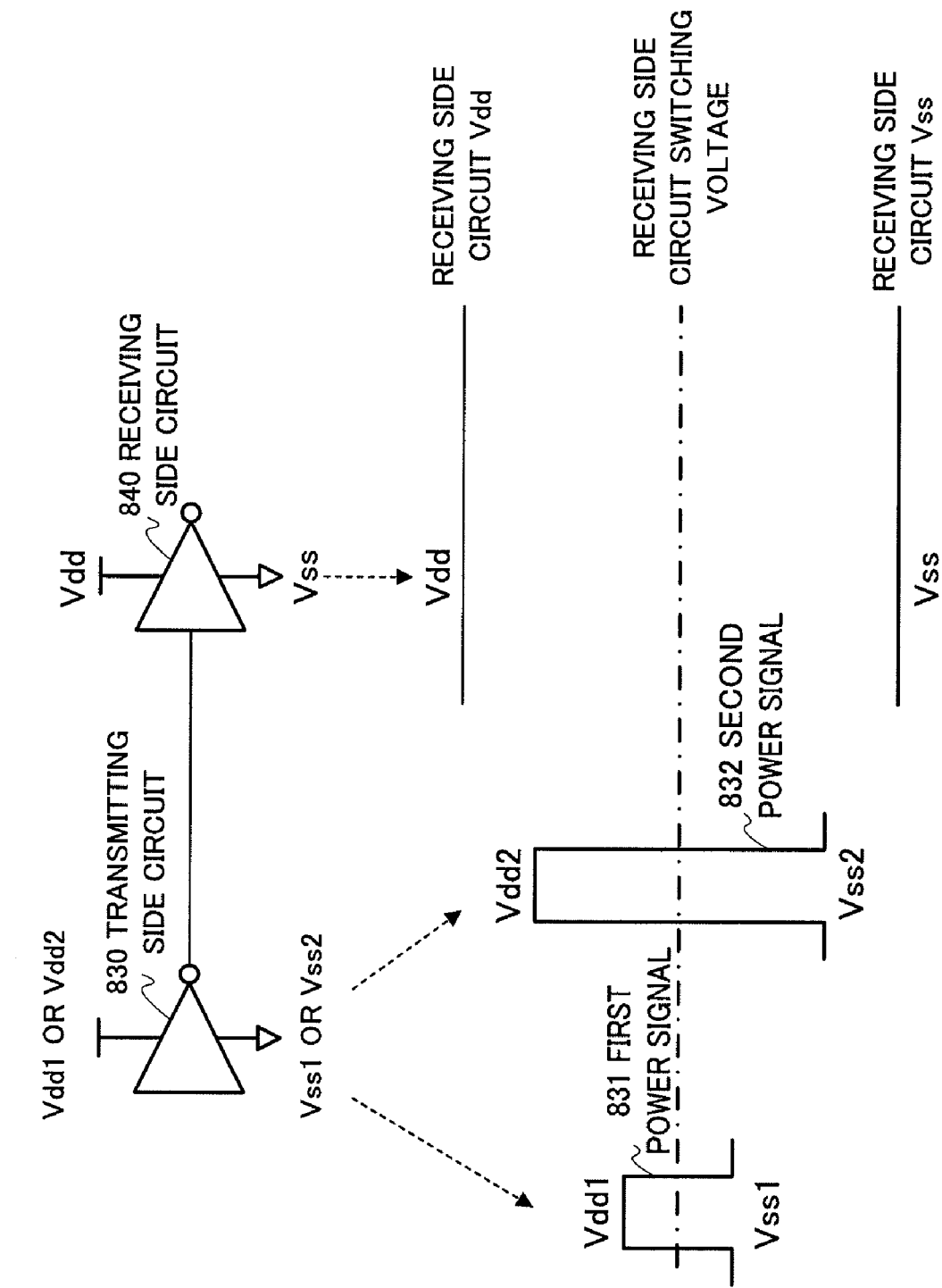
FIG. 9 shows a relationship between output signals of a transmitting side circuit and switching voltages of a receiving side circuit for the case of signal transmission between function circuit blocks having different power supply voltages of this embodiment.

FIG. 9 shows a relationship between an output signal of a transmitting side circuit and a switching voltage of a receiving side circuit in the case of signal transmission between function circuit blocks having different power supply voltages of this embodiment. The case where a signal is transmitted from transmitting side circuit 830 to receiving side circuit 840 is shown. The upper part of FIG. 9 shows an example of transmitting side circuit 830 and receiving side circuit 840. Further, two cases are shown for transmitting side circuit 830, that is, the case where the high potential side potential is Vdd1 and the low potential side potential is Vss1, and the case where the high potential side potential is Vdd2 that is higher than Vdd1 and the low potential side potential is Vss2 that is lower than Vss1. The lower part of FIG. 9 shows the voltages of transmitting side circuit 830 and receiving side circuit 840, and transmitting side circuit 830 outputs first output signal 831 in the case of the combination where the high potential side potential is Vdd1 and the low potential side potential is Vss1, and outputs second output signal 832 in the case of the combination where the high potential side potential is Vdd2 and the low potential side potential is Vss2.

In this embodiment, the switching voltages of the circuits are made substantially the same by adjusting the voltages of Vdd, Vss, Vbp and Vbn between function circuit blocks having different power supply voltages. Specifically, as shown in the lower part of FIG. 9, at transmitting side circuit 830, Vdd1, Vdd2, Vss1, Vss2, Vbp1, Vbp2, Vbn1 and Vbn2 are adjusted by controller 200, and the switching voltage of transmitting side circuit 830 is adjusted to the switching voltage of receiving side circuit 840. As a result of doing this, as is clear from FIG. 9, at transmitting side circuit 830, it is possible to transmit signals to receiving side circuit 840 even in the case of second output signal 832 having a large output amplitude or in the case of first output signal 831 having a small output amplitude.

In addition, in order to make the switching voltages substantially the same, it is only necessary to set the switching voltages of the circuits within a predetermined range, and the switching voltages of the circuits do not have to be made the same. In other words, the output signal of the transmitting side circuit may be set so as to span the switching voltages of the receiving side circuit.

Therefore, according to the semiconductor integrated circuit of this embodiment, it is not necessary to insert level shift circuits between the function circuit blocks having different power supply voltages, and it is possible to avoid extra increase in circuits and increase in a delay time. Further, when signals are transmitted from a logic circuit having a large power supply voltage to a logic circuit having a small power supply voltage, the output amplitude of the transmitting side circuit becomes larger than the power supply voltage of the receiving side circuit, and sufficiently exceeds the switching voltage. Therefore, signal transmission is carried out without any problem, and problems of a penetration current of the receiving side circuit do not occur. Further, if the signal input section of the receiving side circuit is configured only with the gate of a MOS transistor, impedance is extremely high, and unnecessary current therefore does not flow. However, when signals are transmitted from a logic circuit having a small power supply voltage to a logic circuit having a large power supply voltage, as shown in the following, it is necessary to prevent the penetration current of the receiving side circuit.

When signals are transmitted between logic circuits having different power supply voltages, conditions that the penetration current does not flow from the receiving side circuit are that the high level of the output amplitude of the transmitting side circuit is higher than a voltage lower from Vdd corresponding to a threshold voltage of the P-channel MOS transistor, and the low level is lower than a voltage higher from Vss corresponding to a threshold voltage of the N-channel MOS transistor.

In signal transmission between circuits having different power supply voltages, the above conditions are satisfied by adjusting Vdd, Vss, Vbp and Vbn and controlling the power supply voltage and threshold voltage, and it is possible to prevent the penetration current of the receiving side circuit. Further, it is possible to make it easy to prevent the penetration current by making the signal input section of the receiving side signal a Schmidt input.

Further, when the power supply voltage difference is large, by inserting independent circuits having Vdd, Vss, Vbp and Vbn between circuits having a small power supply voltage and circuits having a large power supply voltage and controlling voltages, it is possible to prevent the penetration current.

Moreover, when signals of an internal circuit of function circuit block 400a having a small power supply voltage are transmitted to an internal circuit of function circuit block 400b having a large power supply voltage, when the power supply voltage difference of both blocks is large, even if the signals are transmitted in bursts, there are cases where the above conditions are not satisfied. In this case, a penetration current is generated.

Figure 10:
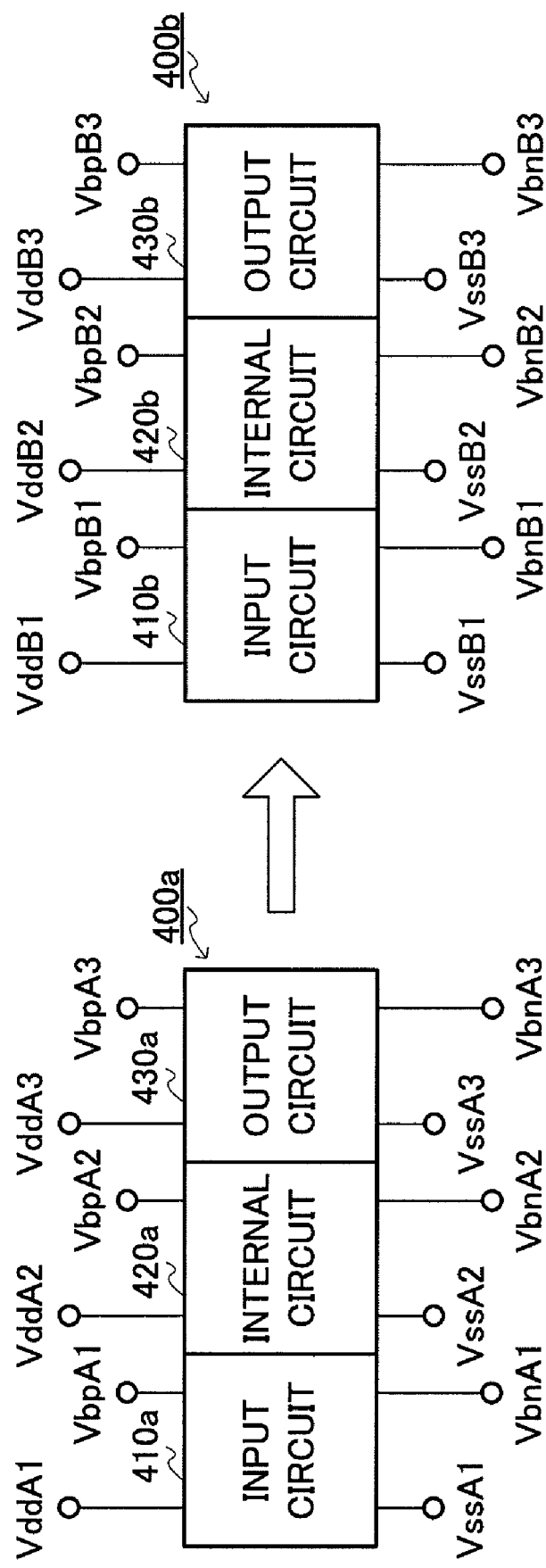
FIG. 10 shows an example of preventing a penetration current of a receiving side circuit between function circuit blocks having different power supply voltages.

FIG. 10 shows an example of preventing the penetration current of a receiving side circuit between function circuit blocks having different power supply voltages. FIG. 10 shows an example of the case of transmitting signals between function circuit block 400a and function circuit block 400b. In FIG. 10, function circuit block 400a is divided into input circuit 410a, internal circuit 420a and output circuit 430a, and is provided with different Vdd, Vss, Vbp and Vbn, respectively. Similarly, function circuit block 400b is divided into input circuit 410b, internal circuit 420b and output circuit 430b, and is provided with different Vdd, Vss, Vbp and Vbn, respectively. In this way, in the case of transmitting signals of an internal circuit of function circuit block 400a having a low power supply voltage to an internal circuit of function circuit block 400b having a high power supply voltage, the output amplitude is controlled in two stages.

Figure 11:
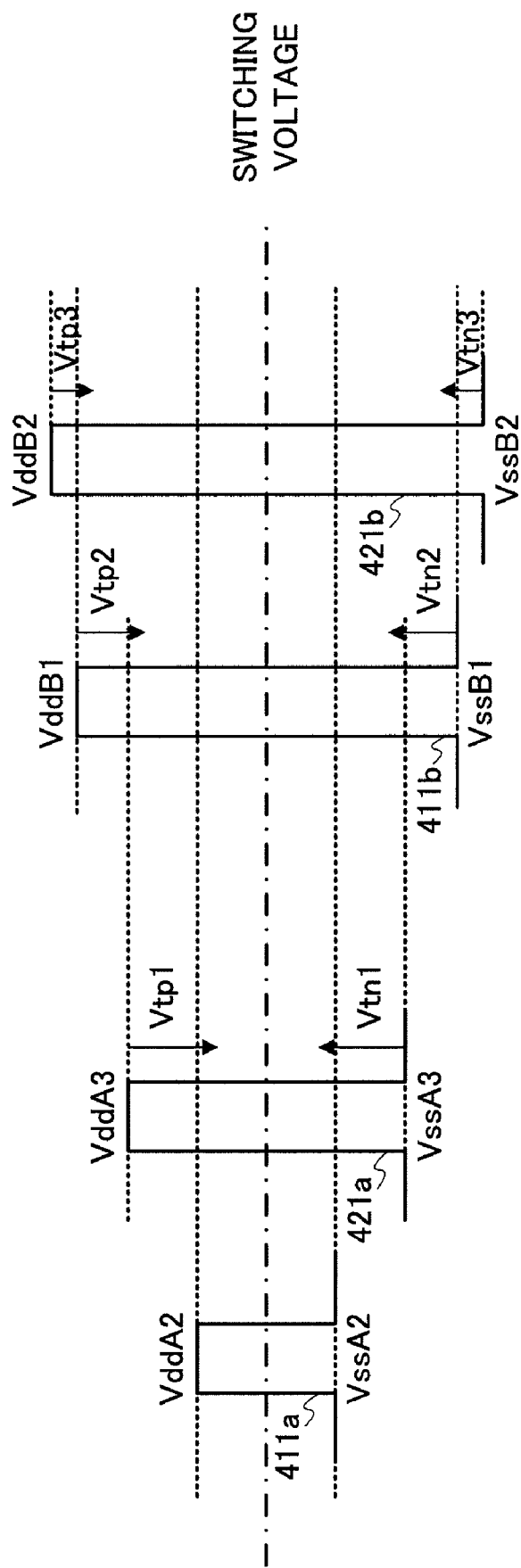
FIG. 11 shows displacement of an output amplitude in the configuration of FIG. 10.

FIG. 11 shows displacement of the output amplitude in the configuration of FIG. 10. FIG. 11 shows output amplitude 411a of internal circuit 420a and output amplitude 421a of output circuit 430a for function circuit block 400a, and shows output amplitude 411b of input circuit 410b and output amplitude 421b of internal circuit 420b for function circuit block 400b. Controller 200 controls the penetration current by controlling the power supply voltage as follows.

Controller 200 controls output amplitude 421a to be large by having the power supply control section apply VddA3 higher than VddA2 of internal circuit 420a and VssA3 lower than VssA2 to output circuit 430a at function circuit block 400a. Further, VbpA3 and VbnA3 applied to output circuit 430a are controlled, and the threshold voltage is adjusted so that a penetration current does not flow. Similarly, controller 200 controls an input amplitude to be small by having the power, supply control section apply VddB1 lower than VssB2 of internal circuit 420b and VssB1 higher than VssB2 to input circuit 410b at function circuit block 400b. Further, controller 200 adjusts VddB1 and VssB1 so that a penetration current does not flow through internal circuit 420b. Finally, between output circuit 430a of function circuit block 400a and input circuit 410b of function circuit block 400b, controller 200 controls VbpB1 and VbnB1 applied to input circuit 410b and adjusts the threshold voltage so that the penetration current does not flow. The adjustment of each potential is carried out as follows. First, a threshold voltage is stored in a memory at controller 200 according to the value of potentials of Vdd, Vss, Vbp and Vbn. In this example, the high level and low level of signal output of the transmitting side circuit, Vdd and Vss of the receiving side circuit, the threshold voltage of the PchMOS transistor, and the threshold voltage of the NchMOS transistor are calculated based on the values in the memory using the steps described above based on the values of Vdd, Vss, Vbp and Vb of internal circuit 420a of function circuit block 400a and internal circuit 420b of function circuit block 400b. Optimum values for Vdd, Vss, Vbp and Vbn of output circuit 430a and input circuit 410b are obtained, and signals (control data) are transmitted to the power supply control section.

Namely, controller 200 adjusts Vdd, Vss, Vbp and Vbn of output circuit 430a of function circuit block 400a and input circuit 410b of function circuit block 400b, and sets conditions that a transmission delay time is short and a penetration current does not flow. Further, there are also cases where it is necessary to take into consideration the power supply voltage difference in advance, provide a plurality of output circuits and input circuits so as to give two stages or more, and adjust the power supply voltage difference.

Figure 12:
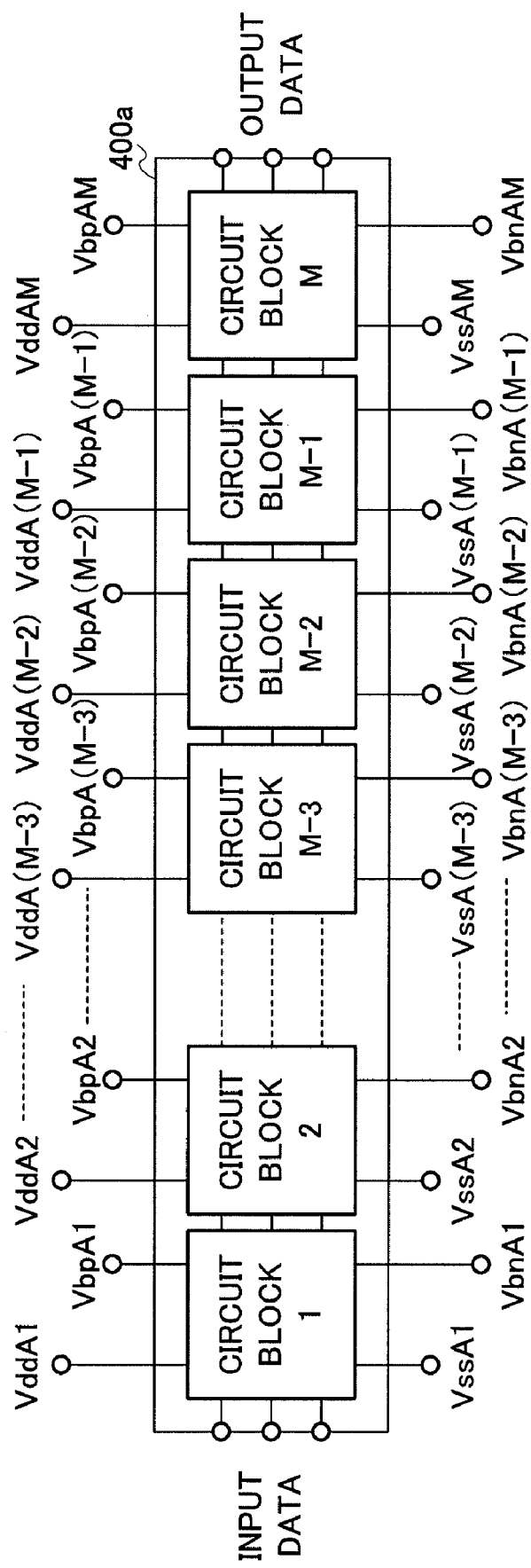
FIG. 12 shows an example of dividing function circuit blocks into a plurality of circuit blocks.
Figure 13:
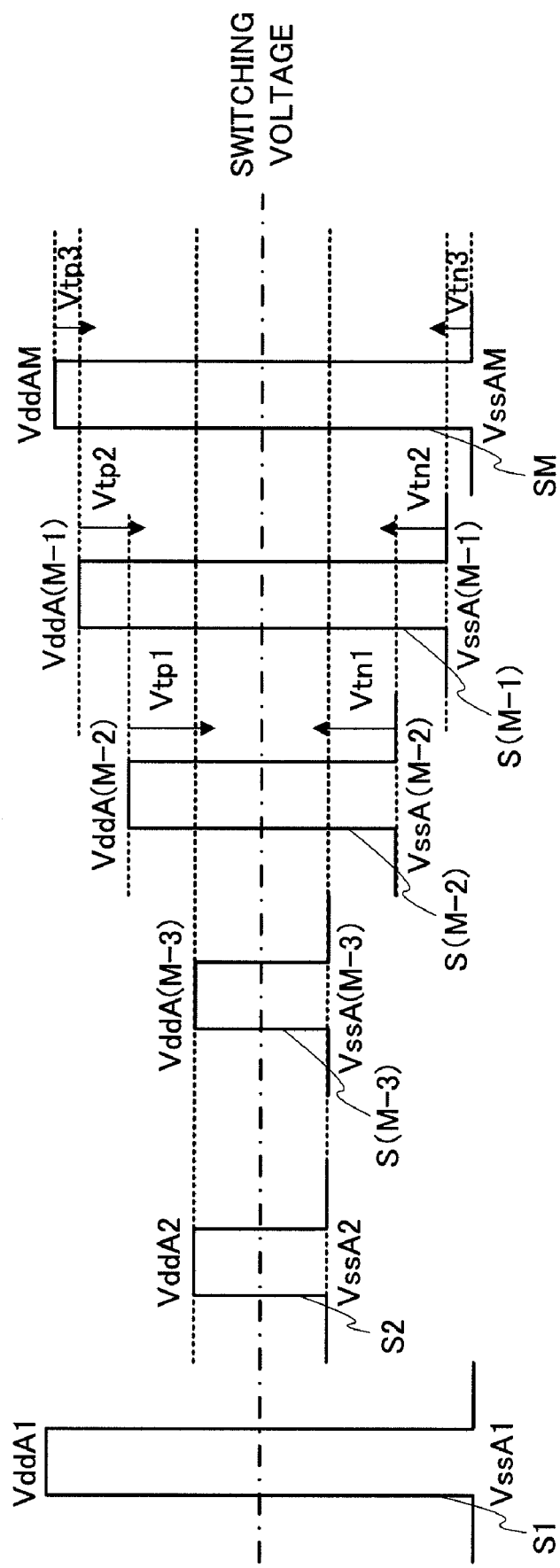
FIG. 13 shows output amplitudes of the plurality of circuit blocks shown in FIG. 12.
Figure 14:
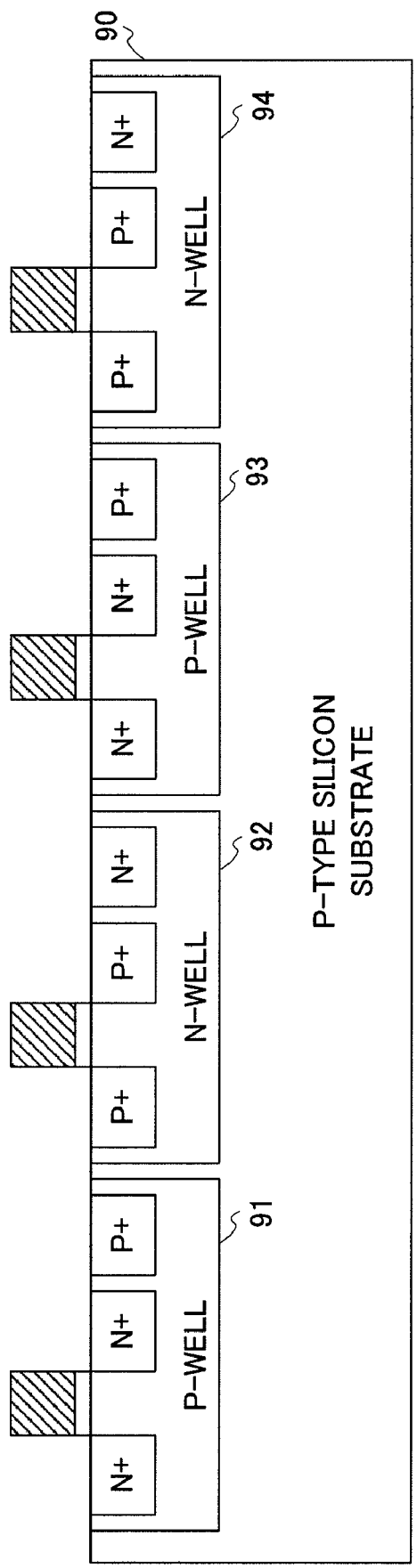
FIG. 14 shows a cross-sectional structure of normal P-channel MOS transistors and N-channel MOS transistors formed on a P-type silicon substrate.

Further, it is also possible to divide function circuit blocks 400a to 400n into a plurality of independent circuit blocks having Vdd, Vss, Vbp and Vbn. FIG. 12 shows an example of dividing function circuit blocks into a plurality of circuit blocks. Further, FIG. 13 shows output amplitudes of the plurality of circuit blocks shown in FIG. 12. FIG. 12 shows circuit blocks 1 to M (partially omitted) arranged within function circuit block 400a, and FIG. 13 shows output amplitudes S1 to SM (partially omitted) of circuit blocks 1 to M. Controller 200 controls the power supply voltage and threshold voltage by adjusting Vdd, Vss, Vbp and Vbn between circuit blocks transmitting signals and between circuit blocks spanning function circuit blocks, and thereby satisfies the above condition, and it is possible to prevent a penetration current.

As shown in FIG. 13, a large power supply voltage (VddA1-VssA1) is applied to circuit block 1 (output amplitude S1). Circuit blocks 2 to (M-3) are applied with a small power supply voltage (VddA2-VssA2) (output amplitudes S2 to S(M-3)). In this way, when an output signal of a circuit block having a large power supply voltage is inputted to a circuit block having a small power supply voltage, the impedance of the input gate is extremely large, so that it is possible to directly input the output signal. On the other hand, when the output signal of a circuit block having a small power supply voltage is inputted to a circuit block having a large power supply voltage, it is necessary to gradually increase the power supply voltage in three stages of circuit blocks from circuit block (M-2) to circuit block M. Output amplitudes S(M-2) to SM become larger in stages. Further, as described above, controller 200 does not generate a penetration current by adjusting Vbp and Vbn of each circuit block.

In the case of FIG. 12, the voltage adjustment of each circuit block is complicated, but it is not necessary to provide buffer circuits for output amplitude adjustment between circuit blocks, so that it is possible to prevent an increase in the circuit scale and an extra delay time.

In this way, when signals are transmitted between function circuit blocks having different power supply voltages or circuit blocks (logic circuits) within function circuit blocks, by adjusting Vdd, Vss, Vbp and Vbn and making the switching voltages of the logic circuits having different power supply voltages substantially the same, it is possible to transmit signals without the need for inserting level shift circuits.

Further, it is possible to prevent a penetration current of the receiving side circuit by controlling Vdd, Vss, Vbp and Vbn and adjusting the power supply voltage and threshold voltage.

The method for making the switching voltages of circuits having different power supply voltages substantially the same is not limited to a semiconductor integrated circuit configured with MOS transistors on an SOI structure silicon substrate, and may also be applied to the case of a semiconductor integrated circuit configured with MOS transistors on a normal silicon substrate.

As described above, according to the preferred embodiments of the present invention, it is possible to freely set Vdd, Vss, Vbp and Vbn between the function circuit blocks and within function circuit blocks, so that it is possible to make the semiconductor integrated circuit operate at an optimum clock frequency, power supply voltage and threshold voltage. It is therefore possible to optimize performance of the semiconductor integrated circuit and minimize power consumption.

Further, by making the switching voltages of the logic circuits substantially the same as described above, level shift circuits are no longer necessary, so that it is possible to prevent an increase in the circuit scale due to unnecessary circuits and increase in a delay time. It is therefore possible to realize both high speed and small surface area of the semiconductor integrated circuit.

The present application is based on Japanese Patent Application No. 2005-051587, filed on Feb. 25, 2005, the entire content of which is expressly incorporated by reference herein.

INDUSTRIAL APPLICABILITY

According to the preferred embodiments of the present invention, it is possible to optimize a clock frequency and power consumption of each function circuit block. Further, when signals are transmitted between function blocks having different power supply voltages or between circuits within the block, by making the switching voltages of the logic circuits substantially the same, it is no longer necessary to insert level shift circuits, so that it is possible to realize high speed and prevent increase in the circuit scale. This is extremely useful for all semiconductor circuits such as portable equipments, particularly large-scale semiconductor integrated circuits and semiconductor integrated circuits using fine process.

The invention claimed is:

1. A semiconductor integrated circuit configured with Metal Insulated Semiconductor transistors formed on a silicon substrate having a Silicon On Insulator structure, comprising a first logic gate and a second logic gate, wherein:
   the first logic gate takes a first potential set having a relatively small potential difference as a power supply voltage;
   the second logic gate takes a second potential set having a relatively large potential difference as a power supply voltage; and
   the semiconductor integrated circuit satisfies at least one of a condition that a substrate potential of a P-channel Metal Insulated Semiconductor transistor of the first logic gate is equal to or higher than a substrate potential of a P-channel Metal Insulated Semiconductor transistor of the second logic gate, and a condition that a substrate potential of an N-channel Metal Insulated Semiconductor transistor of the first logic gate is equal to or lower than a substrate potential of an N-channel Metal Insulated Semiconductor transistor of the second logic gate.

2. The semiconductor integrated circuit according to claim 1, wherein the Metal Insulated Semiconductor transistor formed on the silicon substrate having the Silicon On Insulator structure is partially depleted.

3. A semiconductor integrated circuit configured with Metal Insulated Semiconductor transistors formed on a silicon substrate having a Silicon On Insulator structure, comprising a first logic gate and a second logic gate, wherein:
   the first logic gate takes a first potential set having a relatively small potential difference as a power supply voltage and comprises a Metal Insulated Semiconductor transistor in which a voltage of a reverse direction is applied to a substrate bias; and
   the second logic gates takes a second potential set having a relatively large potential difference as a power supply voltage and comprises a Metal Insulated Semiconductor transistor in which a voltage of a forward direction is applied to the substrate bias.

4. A semiconductor integrated circuit configured with Metal Insulated Semiconductor transistors formed on a silicon substrate having a Silicon On Insulator structure, comprising:
   a circuit block that comprises at least one potential set comprised of a high-potential side potential, a low potential side potential, a P-channel Metal Insulated Semiconductor transistor substrate potential and an N-channel Metal Insulated Semiconductor transistor substrate potential;
   a plurality of power supply wiring that supplies voltages to the potentials included in the potential set;
   a power supply controller that generates voltages for the plurality of power supply wiring; and
   a controller that determines values of voltages generated for the plurality of power supply wiring, and instructs the power supply controller to generate voltages of the determined values.

5. The semiconductor integrated circuit according to claim 4, wherein:
   the circuit block comprises at least two circuits of a first circuit having at least one first logic gate taking the first potential set having a relatively small potential difference as a power supply voltage and a second circuit having at least one second logic gate taking the second potential set having a relatively large potential difference as a power supply voltage; and the semiconductor integrated circuit satisfies at least one of a condition that a substrate potential of a P-channel Metal Insulated Semiconductor transistor of the first circuit is equal to or higher than a substrate potential of a P-channel Metal Insulated Semiconductor transistor of the second circuit, and a condition that a substrate potential of an N-channel Metal Insulated Semiconductor transistor of the first circuit is equal to or lower than a substrate potential of an N-channel Metal Insulated Semiconductor transistor of the second circuit.

6. The semiconductor integrated circuit according to claim 4, wherein:

the circuit block comprises at least two circuits of a first circuit having at least one first logic gate taking the first potential set having a relatively small potential difference as a power supply voltage and a second circuit having at least one second logic gate taking the second potential set having a relatively large potential difference as a power supply voltage;

the first circuit comprises a Metal Insulated Semiconductor transistor in which a voltage of a reverse direction is applied to a substrate bias; and the second circuit comprises a Metal Insulated Semiconductor transistor in which a voltage of a forward direction is applied to the substrate bias.

7. The semiconductor integrated circuit according to claim 4, wherein:

the circuit block comprises at least two circuits of a first circuit having at least one first logic gate taking the first potential set having a relatively small potential difference as a power supply voltage and a second circuit having at least one second logic gate taking the second potential set having a relatively large potential difference as a power supply voltage; and the first circuit comprises a P-channel Metal Insulated Semiconductor transistor and an N-channel Metal Insulated Semiconductor transistor in which a voltage of a reverse direction is applied to a substrate bias.

8. The semiconductor integrated circuit according to claim 4, wherein:

a plurality of circuit blocks comprises a first circuit block having at least one first logic gate taking the first potential set having a relatively small potential difference as a power supply voltage and a second circuit block having at least one second logic gate taking the second potential set having a relatively large potential difference as a power supply voltage; and the semiconductor integrated circuit satisfies at least one of a condition that a substrate potential of a P-channel Metal Insulated Semiconductor transistor of the circuit block gate is equal to or higher than a substrate potential of a P-channel Metal Insulated Semiconductor transistor of the second circuit block, and a condition that a substrate potential of an N-channel Metal Insulated Semiconductor transistor of the first circuit block is equal to or lower than a substrate potential of an N-channel Metal Insulated Semiconductor transistor of the second circuit block.

9. The semiconductor integrated circuit according to claim 4, wherein:

a plurality of circuit blocks are provided and comprise a first circuit block having at least one first logic gate taking the first potential set having a relatively small potential difference as a power supply voltage and a second circuit block having at least one second logic gate taking the second potential set having a relatively large potential difference as a power supply voltage;

the first circuit block comprises a Metal Insulated Semiconductor transistor in which a voltage of a reverse direction is applied to a substrate bias; and the second circuit block comprises a Metal Insulated Semiconductor transistor in which a voltage of a forward direction is applied to the substrate bias.

10. The semiconductor integrated circuit according to claim 4, wherein:

a plurality of circuit blocks are provided and comprise a first circuit block having at least one first logic gate taking the first potential set having a relatively small potential difference as a power supply voltage and a second circuit block having at least one second logic gate taking the second potential set having a relatively large potential difference as a power supply voltage; and the first circuit block comprises a P-channel Metal Insulated Semiconductor transistor and an N-channel Metal Insulated Semiconductor transistor in which a voltage of a reverse direction is applied to a substrate bias.

11. The semiconductor integrated circuit according to claim 4, wherein the controller instructs the power supply controller and controls clock frequencies of clocks supplied to the circuit blocks.

12. The semiconductor integrated circuit according to claim 4, wherein:

the circuit block comprises a first circuit that does not include a critical path and a second circuit that includes a critical path; and the controller calculates voltages supplied to the potentials included in the potential set so that the power supply voltage of the first circuit is made smaller than the power supply voltage of the second circuit, and the threshold voltage of the first circuit is made larger than the threshold voltage of the second circuit, and reports the calculated voltages to the power supply controller.

13. The semiconductor integrated circuit according to claim 4, wherein:

the circuit block comprises a first circuit that includes a storage element section and a second circuit that does not include a storage element section; and the controller stops a clock supplied to the first circuit so that the first circuit enters a data holding state and reports to the power supply controller so that all potential sets of the second circuit or the high potential side potential and the low potential side potential are made a same arbitrary potential.

14. The semiconductor integrated circuit according to claim 4, wherein the controller adjusts the potential of the potential set so that the switching voltage of the circuit block becomes a predetermined value.

15. The semiconductor integrated circuit according to claim 4, wherein:

a plurality of circuit blocks are provided; and the controller makes switching voltages substantially the same between the plurality of circuit blocks.

16. The semiconductor integrated circuit according to claim 4, wherein:

a plurality of circuit blocks comprise a plurality of circuits; and the controller makes switching voltages substantially the same between the plurality of circuits within the circuit blocks.

17. The semiconductor integrated circuit according to claim 4, wherein:

a plurality of circuit blocks are provided; and the controller calculates potentials of the potential set so that an increase of power supply voltages between the plurality of circuit blocks falls within a predetermined range.

18. The semiconductor integrated circuit according to claim 4, wherein:
a plurality of circuit blocks comprise a plurality of circuits; and
the controller calculates potentials of the potential set so that an increase of power supply voltages between the plurality of circuits falls within a predetermined range.

19. The semiconductor integrated circuit according to claim 4, wherein:
a plurality of circuit blocks are provided; and
the controller calculates potentials of the potential set so that a high level of an output signal of a transmitting side circuit between the plurality of circuit blocks is higher than a potential which is lower from the high potential side potential of the receiving side circuit corresponding to a threshold voltage of the P-channel Metal Insulated Semiconductor transistor, and a low level of the output signal of the transmitting side circuit is lower than a potential which is higher from the low potential side potential of the receiving side circuit corresponding to a threshold voltage of the N-channel Metal Insulated Semiconductor transistor.

20. The semiconductor integrated circuit according to claim 4, wherein:
a plurality of circuit blocks comprise a plurality of circuits; and
the controller calculates potentials for the potential set so that a high level of an output signal of a transmitting side circuit between the plurality of circuits is higher than a potential which is lower from the high potential side potential of the receiving side circuit corresponding to a threshold voltage of the P-channel Metal Insulated Semiconductor transistor, and a low level of the output signal of the transmitting side circuit is lower than a potential which is higher from the low potential side potential of the receiving side circuit corresponding to a threshold voltage of the N-channel Metal Insulated Semiconductor transistor.

21. A control method for controlling a semiconductor integrated circuit that is configured with Metal Insulated Semiconductor transistors formed on a silicon substrate having a Silicon On Insulator structure and comprises:
a circuit block that comprises at least one potential set comprised of a high-potential side potential, a low potential side potential, a P-channel Metal Insulated Semiconductor transistor substrate potential and an N-channel Metal Insulated Semiconductor transistor substrate potential;
a plurality of power supply wiring that supplies voltages to the potentials included in the potential set; and
a power supply controller that generates voltages for the plurality of power supply wiring, the control method comprising:
determining values for voltages generated for the plurality of power supply wiring; and
instructing the power supply controller to generate the determined voltages.

* * * * *